United States Patent
Schujman et al.

(10) Patent No.: US 10,801,127 B2
(45) Date of Patent: Oct. 13, 2020

(54) ALUMINUM NITRIDE BULK CRYSTALS HAVING HIGH TRANSPARENCY TO ULTRAVIOLET LIGHT AND METHODS OF FORMING THEM

(71) Applicant: Crystal IS, Inc., Green Island, NY (US)

(72) Inventors: Sandra B. Schujman, Niskayuna, NY (US); Shailaja P. Rao, Albany, NY (US); Robert T. Bondokov, Watervliet, NY (US); Kenneth E. Morgan, Castleton, NY (US); Glen A. Slack, Scotia, NY (US); Leo J. Schowalter, Latham, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

(21) Appl. No.: 16/395,543

(22) Filed: Apr. 26, 2019

(65) Prior Publication Data
US 2019/0316272 A1    Oct. 17, 2019

Related U.S. Application Data

(60) Division of application No. 15/237,113, filed on Aug. 15, 2016, now Pat. No. 10,316,428, which is a
(Continued)

(51) Int. Cl.
*H01L 21/02* (2006.01)
*C30B 23/06* (2006.01)
(Continued)

(52) U.S. Cl.
CPC ............ *C30B 23/066* (2013.01); *C30B 23/00* (2013.01); *C30B 23/002* (2013.01); *C30B 23/02* (2013.01); *C30B 29/403* (2013.01); *H01L 21/02389* (2013.01); *C30B 33/02* (2013.01); *C30B 35/00* (2013.01); *Y10T 428/2982* (2015.01)

(58) Field of Classification Search
CPC . H01L 21/02389; C30B 29/403; C30B 23/00; C30B 33/02; C30B 35/00
See application file for complete search history.

(56) References Cited

U.S. PATENT DOCUMENTS 5,057,287 A   10/1991  Swiggard
5,525,320 A   6/1996   Pratsinis et al.
(Continued)

OTHER PUBLICATIONS

Schlesser et al., "Seeded growth of AlN bulk single crystals by sublimation" Journal of Crystal Growth 241 (2002) p. 416-420.

*Primary Examiner* — Matthew J Song
(74) *Attorney, Agent, or Firm* — Morgan, Lewis & Bockius LLP

(57) ABSTRACT

In various embodiments, methods of forming single-crystal AlN include providing a substantially undoped polycrystalline AlN ceramic having an oxygen concentration less than approximately 100 ppm, forming a single-crystal bulk AlN crystal by a sublimation-recondensation process at a temperature greater than approximately 2000° C., and cooling the bulk AlN crystal to a first temperature between approximately 1500° C. and approximately 1800° C. at a first rate less than approximately 250° C./hour.

22 Claims, 9 Drawing Sheets

Related U.S. Application Data continuation of application No. 14/687,993, filed on Apr. 16, 2015, now Pat. No. 9,447,519, which is a continuation of application No. 12/827,507, filed on Jun. 30, 2010, now Pat. No. 9,034,103, which is a continuation-in-part of application No. 11/731,790, filed on Mar. 30, 2007, now Pat. No. 8,012,257.

(60) Provisional application No. 60/787,399, filed on Mar. 30, 2006.

(51) Int. Cl.
  *C30B 23/00* (2006.01)
  *C30B 29/40* (2006.01)
  *C30B 23/02* (2006.01)
  *C30B 33/02* (2006.01)
  *C30B 35/00* (2006.01)

(56) References Cited

U.S. PATENT DOCUMENTS

| | | |
|---|---|---|
| 5,909,036 A | 6/1999 | Tanaka et al. |
| 6,840,431 B1 | 1/2005 | Kim |
| 7,087,112 B1 | 8/2006 | Rojo et al. |
| 7,638,346 B2 | 12/2009 | Schowalter et al. |
| 8,012,257 B2 | 9/2011 | Morgan et al. |
| 9,034,103 B2 | 5/2015 | Schujman et al. |
| 2003/0127044 A1 | 7/2003 | Schowalter et al. |
| 2003/0168003 A1 | 9/2003 | Schowalter et al. |
| 2004/0022715 A1 | 2/2004 | Miura et al. |
| 2005/0070421 A1 | 3/2005 | Kanechika et al. |
| 2005/0087124 A1 | 4/2005 | Dwilinski et al. |
| 2005/0142391 A1* | 6/2005 | Dmitriev ............... C30B 25/00 428/698 |
| 2005/0258759 A1 | 11/2005 | Wei |
| 2006/0005763 A1 | 1/2006 | Schowalter et al. |
| 2006/0183625 A1 | 8/2006 | Miyahara |
| 2007/0082019 A1 | 4/2007 | Huang et al. |
| 2007/0101932 A1 | 5/2007 | Schowalter et al. |
| 2007/0131160 A1 | 6/2007 | Slack et al. |
| 2007/0134827 A1 | 6/2007 | Bondokov et al. |
| 2007/0243653 A1 | 10/2007 | Morgan et al. |
| 2007/0257333 A1 | 11/2007 | Schlesser et al. |
| 2010/0147211 A1 | 6/2010 | Miyanaga et al. |
| 2011/0008621 A1 | 1/2011 | Schujman et al. |
| 2017/0145592 A1 | 5/2017 | Bondokov et al. |

* cited by examiner

ALUMINUM NITRIDE BULK CRYSTALS HAVING HIGH TRANSPARENCY TO ULTRAVIOLET LIGHT AND METHODS OF FORMING THEM

RELATED APPLICATIONS

This application is a division of U.S. patent application Ser. No. 15/237,113, filed on Aug. 15, 2016, which is a continuation of U.S. patent application Ser. No. 14/687,993, filed on Apr. 16, 2015, which is a continuation of U.S. patent application Ser. No. 12/827,507, filed on Jun. 30, 2010, which is a continuation-in-part of U.S. patent application Ser. No. 11/731,790, filed Mar. 30, 2007, which claims the benefit of and priority to U.S. Provisional Application Ser. No. 60/787,399, filed Mar. 30, 2006. The entire disclosure of each of these applications is hereby incorporated by reference.

GOVERNMENT SUPPORT

This invention was made with United States Government support under 70NANB4H3051 awarded by the National Institute of Standards and Technology (NIST). The United States Government has certain rights in the invention.

FIELD OF THE INVENTION

The technology disclosed herein relates generally to semiconductor crystals, in particular semiconductor crystals having high transparency to ultraviolet light.

BACKGROUND

Semiconductor materials exhibit controllable optical and electrical properties, such as conductivity, over a wide range. Such control is enabled by use of dopants, which are impurities intentionally introduced into the crystalline lattice of the semiconductor material to serve as sources of electrons (negative charges) or holes (positive charges). Controllable doping enables the fabrication of a wide range of semiconductor devices, e.g., light-emitting diodes (LEDs), lasers, and transistors.

Nitride-based semiconductors such as gallium nitride (GaN) and aluminum nitride (AlN) are of great interest technologically, in part because of their wide bandgaps. Controllable and repeatable doping of these materials enables the fabrication of light-emitting devices, such as LEDs and lasers, that emit light at short wavelengths, i.e., at blue, violet, and even ultraviolet (UV) wavelengths. Moreover, n- and p-type nitrides can be utilized in the fabrication of transistors suited for high power and/or high temperature applications. In an n-type semiconductor, the concentration of electrons is much higher than the concentration of holes; accordingly, electrons are majority carriers and dominate conductivity. In a p-type semiconductor, by contrast, holes dominate conductivity.

AlN has a relatively large bandgap of 6.1 electron volts (eV) at room temperature, and few dopants for AlN have shallow enough energy levels in the bandgap to facilitate high electrical conductivity with only moderate dopant concentrations. Thus, dopant concentrations often need to be relatively high in order to achieve technologically useful conductivity levels. Unfortunately, achieving high dopant concentration levels in AlN can be difficult. AlN is typically grown at very high temperatures, making it difficult to incorporate high levels of desired dopants in a controlled way while avoiding the introduction of unwanted impurities and other point defects. These will introduce deep levels in the bandgap that counteract the desired effect of the dopant. (That is, the undesired defects will introduce deep levels that will absorb the electrons or holes introduced by the dopants.) In particular, under typical growth conditions, oxygen appears to introduce a deep level in the AlN bandgap and needs to be carefully controlled if conducting crystals are to be produced. Thus, success in creating large, conductive crystals has proven elusive even though AlN thin films with n-type conductivity have been demonstrated.

Furthermore, whether doped or undoped, AlN with high transparency to particular wavelengths of light, e.g., UV light, is generally difficult to produce due to oxygen impurities and/or point defects introduced during the fabrication process.

SUMMARY

In accordance with the present invention, a donor or acceptor level is created within the perfect, stoichiometric AlN or $Al_xGa_{1-x}N$ (where $0 \leq x < 1$, herein sometimes referred to as AlGaN) lattice by introducing a substitutional dopant that has greater or fewer electrons than aluminum (Al) or nitrogen (N). Charge-compensating defects, such as vacancies on the Al cation site (designated as $V_{Al}$) or the N anion site (designated as $V_N$) or impurities with deep levels which will trap the free charge created by the dopant, are desirably avoided but, more generally, are either reduced in density or less active. In order to use atoms that have nearly the same diameter as Al or N and avoid local strain, dopants are preferably selected from the upper part of the periodic table. Choices for the Al site include beryllium (Be), magnesium (Mg), zinc (Zn), carbon (C), and silicon (Si) while C, and Si are possible choices for the N site (oxygen (O) is desirably avoided for reasons detailed below). Dopants with two fewer electrons than Al, such as lithium (Li), may also be used to make p-type AlN and AlGaN if they can be introduced on the Al site.

Furthermore, embodiments of the invention feature methods of producing highly transparent (e.g., to UV light) crystals of, e.g., AlN, via control of oxygen content in the Al starting material and during crystal growth, as well as control of point-defect introduction during cooling from the growth temperature.

In one aspect, embodiments of the invention feature a method of forming single-crystal AlN including or consisting essentially of providing a substantially undoped polycrystalline AlN ceramic having an oxygen concentration less than approximately 100 ppm, utilizing the polycrystalline ceramic, forming a single-crystal bulk AlN crystal by a sublimation-recondensation process at a temperature greater than approximately 2000° C., and, after the sublimation-recondensation process, cooling the bulk AlN crystal to a first temperature between approximately 1500° C. and approximately 1800° C. at a first rate less than approximately 250° C./hour (in order to, e.g., minimize formation of point defects therein).

Embodiments of the invention may include one or more of the following in any of a variety of combinations. The bulk AlN crystal may be cooled from the first temperature to a second temperature lower than the first temperature (e.g., approximately room temperature) at a second rate faster than the first rate. The first rate may range between approximately 70° C./hour and approximately 150° C./hour.

Providing the polycrystalline AlN ceramic may include or consist essentially of cleaning a substantially undoped Al pellet and reacting the Al pellet with nitrogen gas to form the polycrystalline AlN ceramic. The polycrystalline AlN ceramic may have the oxygen concentration of less than approximately 100 ppm after reaching approximately room temperature after the reaction (e.g., without further processing by, for example, sublimation-recondensation processes). The polycrystalline AlN ceramic may not undergo any sublimation-recondensation treatment prior to the sublimation-recondensation process to form the bulk AlN crystal. A plurality of additional substantially undoped Al pellets may be cleaned and reacted. Cleaning the Al pellet may include or consist essentially of exposing the undoped Al pellet to hydrofluoric acid. Cleaning the Al pellet may include or consist essentially of exposing the undoped Al pellet to an organic solvent, exposing the undoped Al pellet to hydrochloric acid, and, thereafter, exposing the undoped Al pellet to an acid mixture including or consisting essentially of nitric acid and hydrofluoric acid (and possibly water).

The absorption coefficient of the bulk AlN crystal may be less than approximately 20 $cm^{-1}$ in the entire wavelength range between about 4500 nm and approximately 215 nm. The absorption coefficient of the bulk AlN crystal may be less than approximately 10 $cm^{-1}$ for the entire wavelength range between approximately 400 nm and approximately 250 nm. The oxygen concentration of the bulk AlN crystal may be less than approximately 5 ppm. An AlN seed may be provided during the sublimation-recondensation process, and the bulk AlN crystal may form on the AlN seed.

In another aspect, embodiments of the invention feature an AlN single crystal having a thickness greater than approximately 100 µm, a cross-sectional area greater than approximately 1 $cm^2$, and an absorption coefficient of less than approximately 20 $cm^{-1}$ in the entire wavelength range between about 4500 nm and approximately 215 nm. The absorption coefficient may be less than approximately 10 $cm^{-1}$ for the entire wavelength range between approximately 400 nm and approximately 250 nm.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and in some embodiments, ±5%. The term "consists essentially of" means excluding other materials that contribute to function, unless otherwise defined herein. The terms "undoped" and "substantially undoped" mean at least substantially free of intentional dopants, as even undoped materials may incorporate slight amounts of unintentional dopants or other impurities. Relative to steps herein described utilizing liquid reagents (e.g., acids or organic solvents), to "expose" means to place in significant physical contact with, including but not limited to immersing, spray-applying, etc.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
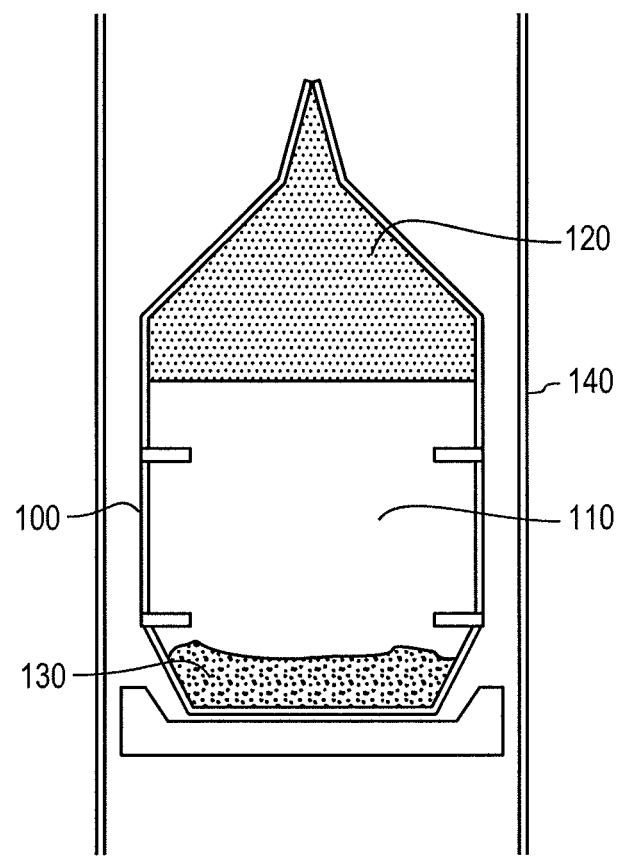
FIG. 1 schematically depicts a crystal growth enclosure for the growth of single-crystalline AlN.

A representative environment for practice of embodiments of the present invention is shown in FIG. 1. AlN crystals may be formed by the sublimation-recondensation method described in U.S. Pat. No. 7,638,346, the entire disclosure of which is herein incorporated by reference. A crystal growth enclosure 100 includes a vapor mixture 110, an AlN crystal 120, and a polycrystalline source 130, and is surrounded by a furnace 140. In an embodiment, crystal growth enclosure 100 includes or consists essentially of tungsten. In alternative embodiments, crystal growth enclosure 100 includes a tungsten-rhenium alloy, rhenium, carbon, tantalum carbide, tantalum nitride, tantalum carbonitride, hafnium nitride, mixtures of tungsten and tantalum, or a combination thereof, as described in U.S. Pat. No. 7,211,146, the entire disclosure of which is hereby incorporated by reference. Crystal growth enclosure 100 may even consist essentially of one or more of these materials.

Vapor mixture 110 arises from the heating of polycrystalline source 130 at one end of crystal growth enclosure 100, and coalesces into AlN crystal 120 at another, cooler end. In an embodiment, during formation of AlN crystal 120, high-purity $N_2$ or forming gas (i.e., a mixture of nitrogen with hydrogen, with a hydrogen concentration ranging between approximately 3% and approximately 5%) may be flowed through the enclosure 100, which may be subsequently heated to a temperature ranging between approximately 2000° C. and approximately 2380° C. In particular, in one embodiment, the temperature of enclosure 100 may be substantially maintained between about 2200° C. and about 2310° C. Polycrystalline source 130 may be a ceramic material, may include or consist essentially of AlN (e.g., high-purity AlN), and may further include at least one interstitial or substitutional dopant. AlN crystal 120 is a bulk crystal (i.e., not a powder), may be single crystal, and may include finite concentrations of interstitial or substitutional dopants. In various embodiments, AlN crystal 120 is substantially free of dopants, is extremely high purity, and exhibits high transparency, as detailed below. Upon further treatment, the dopants may be electrically activated to dope AlN crystal 120 and provide it with desirable electrical properties. In all embodiments described herein, AlN crystal 120 may also include gallium (Ga), rendering it an $Al_xGa_{1-x}N$ crystal. For example, Ga may be added to polycrystalline source 130 such that the crystal coalesces as $Al_xGa_{1-x}N$. In such a case, the crystal may have an Al concentration greater than approximately 50%. AlN crystal 120 may have a thickness of greater than approximately 0.1 mm and a diameter greater than approximately 1 cm. The diameter may even be greater than approximately 2 cm. AlN crystal 120 may be single crystalline.

The ensuing discussion describes selection of dopant species for AlN crystal 120 (and therefore for polycrystalline source 130), as well as techniques for producing various types of polycrystalline source 130 with desired properties (e.g., dopant and purity concentrations), before returning to the details of fabricating AlN crystal 120 and subsequent processing thereof.

Dopant Selection

In accordance with embodiments of the present invention, the first step in making doped AlN crystal 120 is identifying which impurities or impurity pairs may produce donor or acceptor centers with a small activation energy. For the Al site, appropriate single-element donors may be group IV elements such as Si, Ge, and/or transition elements such as Ti, V, etc., while for the N site, group VI elements such as S may be used as donors. If interstitial sites are considered, lighter elements, such as H or Li, may be suitable donors. If one considers co-doping with molecular impurities where both donors and acceptors are incorporated on the same sublattice, then impurities such as $BeSiN_2$, $ZnSiN_2$, $MgSiN_2$, $LiSi_2N_3$, and $Al_2OC$ may be considered, as described in U.S. Pat. No. 7,641,735, the entire disclosure of which is hereby incorporated by reference. All of these approaches desirably require the controlled introduction of dopants into the crystal during the bulk crystal growth process. Two other possible dopant-generation schemes are nuclear-transmutation doping and in-diffusion of the dopant from the crystal surface. However, these last two approaches may be more difficult with bulk crystals thicker than approximately 2 mm because diffusion times may be too long to be practical and the implantation energies required may be too high. Hence, embodiments of the present invention preferably utilize dopants that may be introduced during bulk crystal growth.

The next step is to select an appropriate dopant, i.e., one that can withstand the sublimation-recondensation growth process at temperatures up to 2330° C. (at which temperature tungsten crucibles may undergo a eutectic reaction) or hotter if an alternative crucible is used. (U.S. Pat. No. 6,719,843, the entire disclosure of which is hereby incorporated by reference, describes other possible crucible materials for growth of AlN bulk single crystals.) In AlN and $Al_xGa_{1-x}N$ thin epitaxial films, it has been found that Si is a shallow donor. In Si-doped GaN, n-type carrier concentrations at room temperature up to $1\times10^{20}/cm^3$ have been achieved. It has been observed to become degenerate above about $1\times10^{18}/cm^3$ of Si, i.e., the conductivity is observed to become temperature-independent due to the high density of dopant. In Si-doped AlN, the highest room-temperature carrier concentration obtained appears to be about $2\times10^{20}/cm^3$. The following discussion addresses the factors limiting Si solubility in AlN and its electrical activation, as well as the implications for crystal growth.

The covalent radii of Al and Si are quite similar. In AlN, the average Al—N bond distance is 1.89 Å. Thus, Si atoms are about 10% smaller than Al atoms in these nitrides. In the pseudobinary system AlN—$Si_3N_4$ one ternary compound, $Si_3Al_5N_9$, is known. It may only exist in the presence of oxygen as an impurity. While the solid solubility limit of $Si_3N_4$ in AlN (or of AlN in $Si_3N_4$) at room temperature or at higher temperatures is somewhat uncertain (and is discussed below), there is ample evidence to show that concentrations attractive to doping AlN are possible and are stable at the temperatures required for bulk crystal growth of AlN.

It has been shown that Si-doped AlN exhibits excellent blue luminescence, both photoluminescence and cathodoluminesence. This result has encouraged several studies of the upper limit of r, defined to be the Si/Al atom ratio in Si-doped AlN. In analogy with typical solubility behavior, we expect that as the temperature increases, the solubility of $Si_3N_4$ in AlN will increase.

Formation of AlN Ceramic with Controlled Dopant Concentrations

Providing a polycrystalline source 130 that includes or consists essentially of AlN with carefully controlled dopant concentrations (including the elimination of potential deep-level impurities such as oxygen) enables growth of AlN with controllable electrical and optical properties. In general, oxygen is a common contaminant, and the highest-purity AlN material that may be purchased commercially has oxygen impurities at a level exceeding 0.3% by weight (i.e., exceeding 3000 ppm by weight); therefore, references herein to dopants, dopant species, or intentionally introduced impurities generally exclude oxygen unless otherwise indicated. Because the vapor pressures of oxides of aluminum are much higher than those of Al or of $N_2$ above contaminated AlN, the commercial powder may be purified by heating to 2000° C. or so in a clean $N_2$ atmosphere. Unfortunately, the contaminated powder will tend to sinter during the heating cycle and become dense while trapping the residual oxygen within the sintered mass. An alternative approach is to sublime (i.e., congruently evaporate Al and $N_2$ molecules) the contaminated AlN in a $N_2$ atmosphere under a temperature gradient so that AlN will recondense at a colder place in the furnace. Aluminum oxynitrides will condense at even colder temperatures and so higher purity AlN ceramic will be physically separated from the aluminum oxynitride. While this process is useful in obtaining higher-purity AlN, it is time consuming and requires the dedication of a high temperature furnace since reasonable evaporation rates will require the furnace to be operated at temperatures above 2200° C. In addition, it is difficult to obtain AlN with oxygen impurity concentrations below 400 ppm with this method, probably due to the solubility of oxygen in the AlN crystal.

Herein, oxygen concentrations are preferably measured by the TCH600 Oxygen Determinator, available from LECO Corporation of St. Joseph, Mich., the Neutron Activation Analysis technique, or by dynamic secondary ion mass spectroscopy (SIMS). The commercially available LECO measurement is reliable to at least a detection limit of 200 ppm by weight with normal non-inert atmosphere sample handling (surface contamination) of the oxygen-sensitive AlN. In addition, we have found neutron activation to be capable of a detection limit down to at least 100 ppm for polycrystalline ceramic material. For single-crystal samples, accurate oxygen measurements may be made with dynamic SIMS, which may be calibrated using isotope implant techniques to confirm the validity of the measurement. All of these measurement techniques are preferred over glow-discharge mass spectroscopy (GDMS), which is notoriously difficult and may give erroneously low measurements.

A more efficient way to make AlN with controllable impurities is to react, in high-purity nitrogen, either high-purity Al metal or Al metal that is intentionally doped with the desired impurity and nothing else. In Slack and McNelly, J. Crystal Growth 34, 263 (1976), the entire disclosure of which is hereby incorporated by reference, the problem of trying to burn Al directly in nitrogen is described. In particular, at atmospheric pressure, the Al will react to form a protective skin around the unreacted Al metal and the reaction will stop. It has been demonstrated (M. Bockowski, A. Witek, S. Krukowski, M. Wroblewski, S. Porowski, R. M. Ayral-Marin, and J. C. Tedenac, Journal of Materials Synthesis and Processing, 5, 449 (1997), the entire disclosure of which is hereby incorporated by reference) that very high nitrogen pressures may be used to keep the reaction going. However, the reacted AlN will form a powder and will quickly become contaminated when exposed to air. It is much more desirable to form a dense AlN material with limited surface area which will make it much easier to handle the AlN product without contaminating it.

In previous pellet-drop work by Slack and McNelly (J. Crystal Growth 42, 560 (1977), the entire disclosure of which is hereby incorporated by reference), Al pellets were dropped into a pyrolytic boron nitride (pBN) crucible that is heated to about 1850° C. in an RF-heated furnace. The individual pellets of Al were rapidly reacted to form AlN. Slack and McNelly obtained AlN with about 1% excess Al by weight and a residual oxygen contamination of about 400 ppm. After the AlN was formed, the pBN crucible had to be mechanically removed and the resulting AlN had to be sublimed in a temperature gradient in a nitrogen atmosphere. Slack and McNelly used the last step (sublimation and recondensation of the AlN polycrystalline material) to reduce the excess Al to less than 0.1%. This sublimation and recondensation step was reported to take between 12 and 24 hours for 70 grams of AlN product. In accordance herewith, a pellet-drop method produces AlN polycrystalline material with controlled dopant concentrations (including no dopants so that the AlN is high-purity) that may be used directly for AlN crystal growth without the extra step of subliming and recondensing the resulting AlN polycrystalline material. In addition, the resulting AlN polycrystalline material has lower oxygen contamination. Embodiments of the invention preferably utilize a crucible material that 1) does not react with the AlN polycrystalline material, and 2) may remain on the AlN polycrystalline material during subsequent sublimation-recondensation growth of AlN single crystals from the polycrystalline material.

Highly silicon-doped AlN may be produced by burning an Al—Si alloy in a nitrogen atmosphere at about 1850° C. and at 1 bar or higher pressure. At 1875° C., the $N_2$ dissociation pressure of $Si_3N_4$ is approximately 1 bar, which may set a preferred upper limit on the burning temperature at 1 bar since $Si_3N_4$ formation may result at high Si concentrations. In this way, some or all of the Si becomes entrapped in the AlN lattice.

The Al—Si phase diagram shows that the maximum equilibrium solid solubility of Si in metallic Al is 1.59 atom % at 577° C. If the liquid alloys are rapidly quenched, then considerably more Si may be trapped in solid solution in the Al metal. In fact, high-purity Si-doped Al may be purchased with Si concentrations of up to 3.5%, although it is likely that higher concentrations of Si in Al may be obtained through rapid quenching of a molten Al and Si mixture.

Below, two examples are given of forming polycrystalline AlN material with controlled dopant concentrations.

Production of Doped, High-Density AlN Polycrystalline Material

Figure 2A:
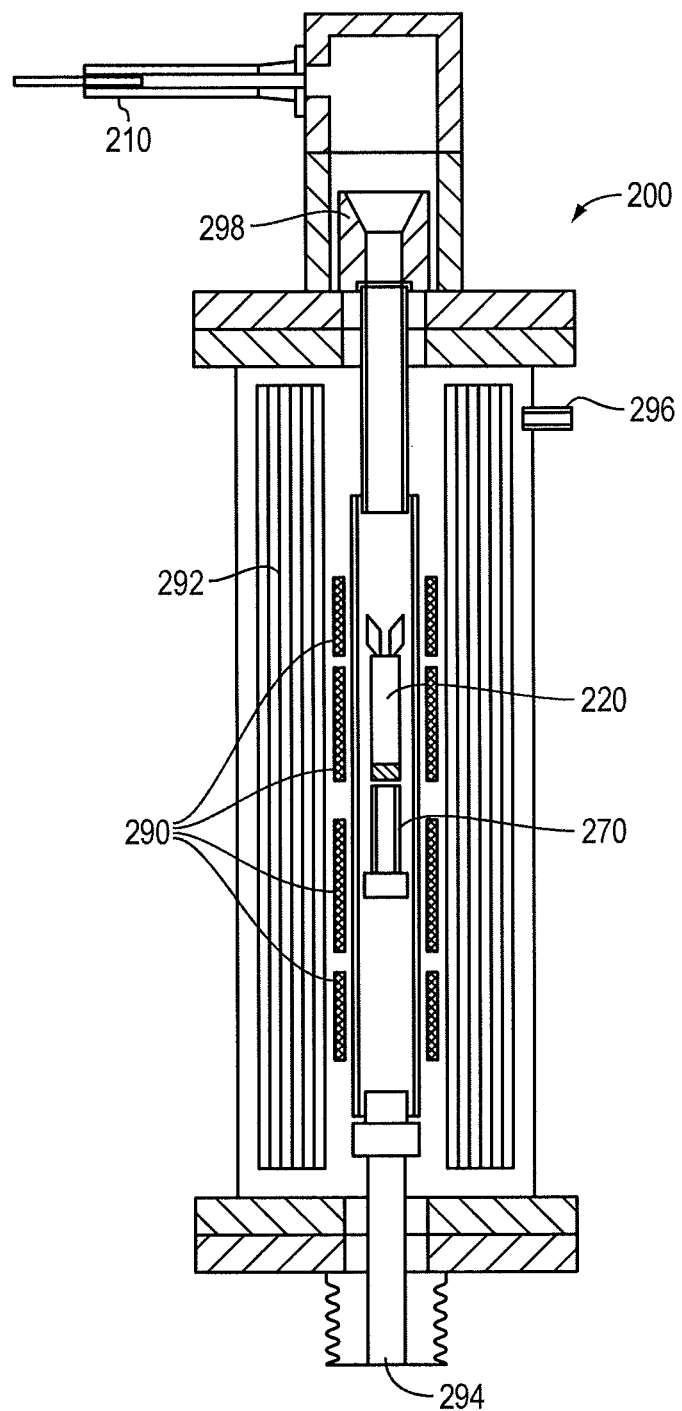
FIGS. 2A and 2B are schematic diagrams of a furnace utilized for the formation of polycrystalline source material as described in one embodiment of the invention.
Figure 2B:
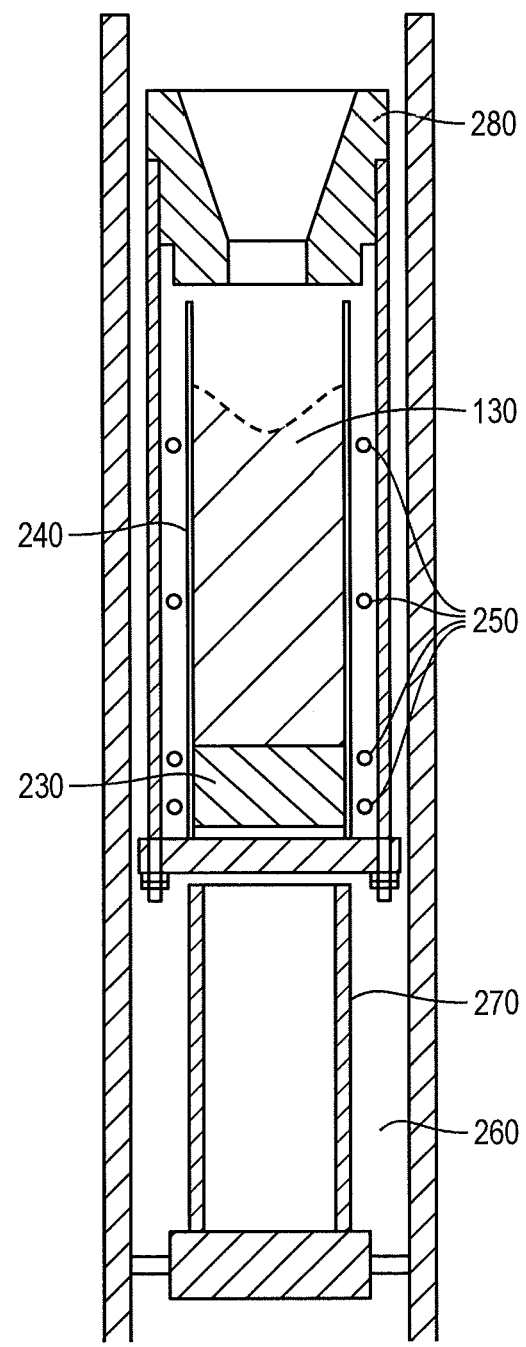
Figure 3A:
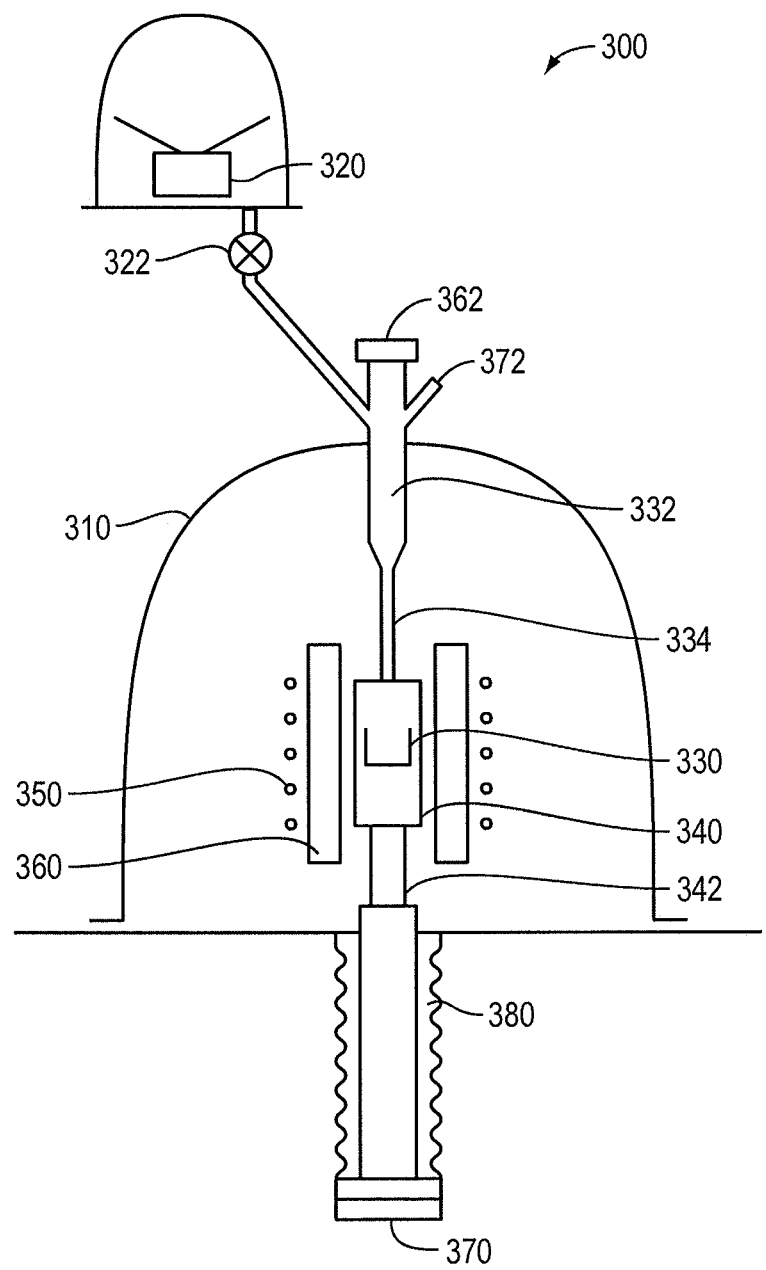
FIGS. 3A-3E are schematic diagrams of a reactor utilized for the formation of polycrystalline source material as described in another embodiment of the invention.
Figure 3B:
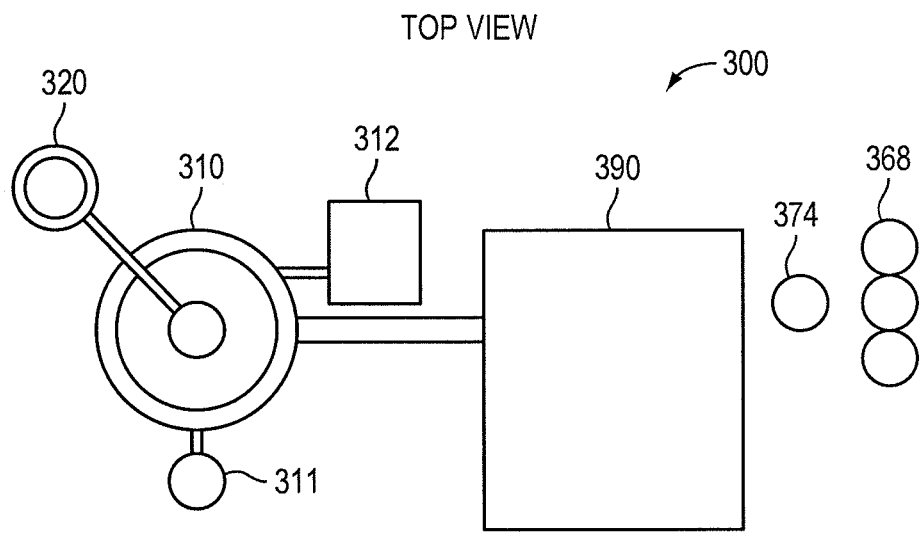
Figure 3C:
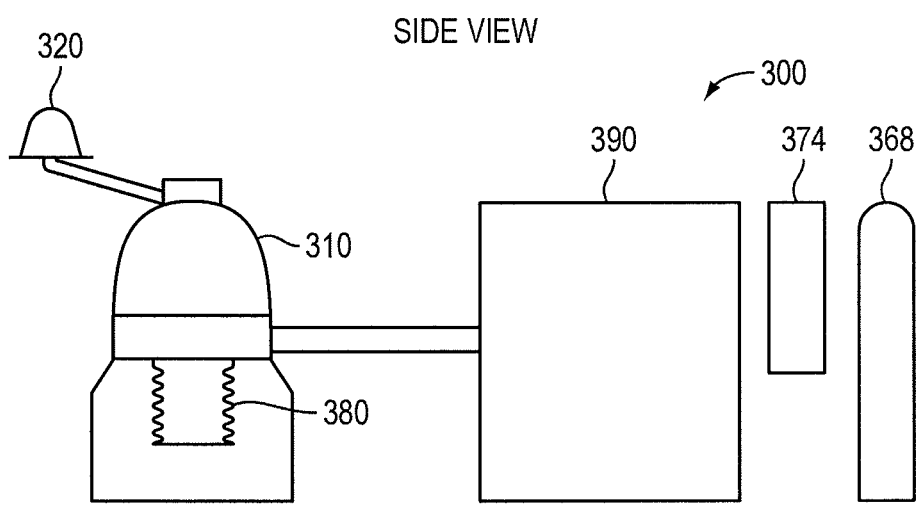
Figure 3D:
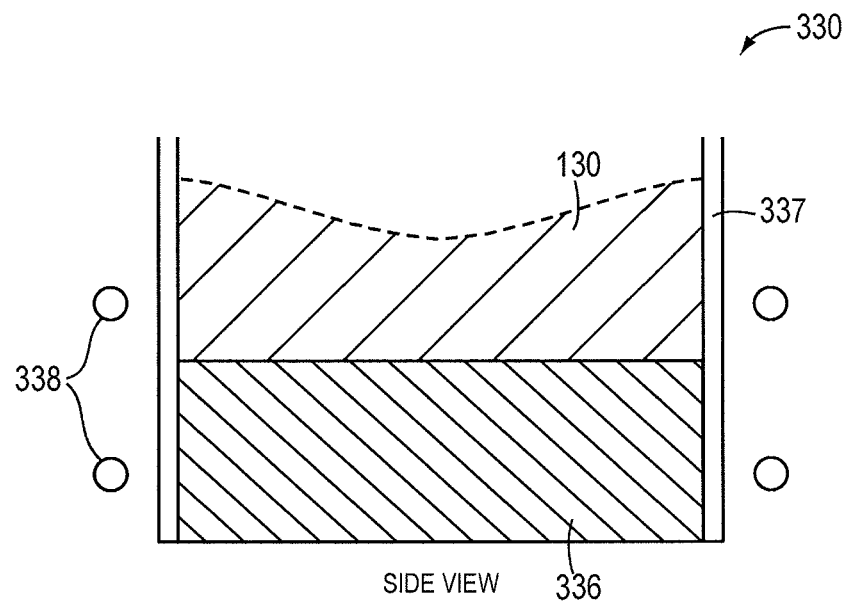
Figure 3E:
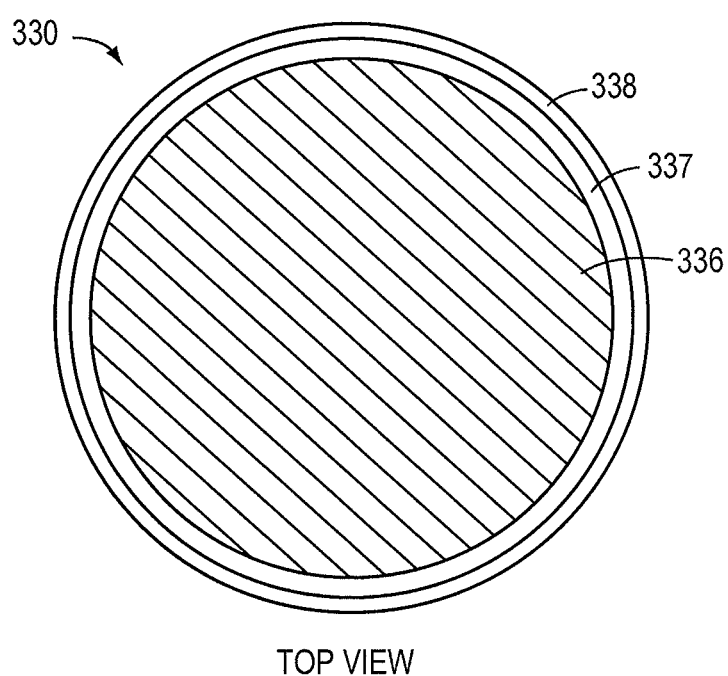

Referring to FIGS. 2A and 2B, a furnace 200 may be utilized in the formation of polycrystalline source 130 incorporating a high concentration of at least one substitutional dopant. Furnace 200 includes a pellet loading mechanism 210, which drops pellets including or consisting essentially of Al into a crucible 220. In an embodiment, the pellets may be intentionally doped with one or more dopant species in excess of amounts of trace impurities that may be present in pellets consisting essentially of Al. In an embodiment, the dopant concentration in the pellets is greater than approximately 1% and less than approximately 12% by weight. In various embodiments, crucible 220 includes a bottom plug 230 and a foil wrap 240. Bottom plug 230 may be approximately cylindrical with, e.g., a diameter of approximately 0.625 inches and a height of approximately 0.5 inches. Bottom plug 230 may include or consist essentially of tungsten (W), or another high-melting-point material inert to AlN. Foil wrap 240 wraps around bottom plug 230, forming a cylinder open at the top and sealed at the bottom by bottom plug 230. Foil wrap 240 may include or consist essentially of W, or another high-melting-point material inert to AlN, and may have a thickness of approximately 0.001 inch. In an embodiment, foil wrap 240 is wrapped around bottom plug 230 multiple times, e.g., a three-ply foil wrap 240 is formed by wrapping W foil around bottom plug 230 three times. Foil wrap 240 may be held in place by at least one wire 250, which may include or consist essentially of a tungsten-rhenium alloy (e.g., 25% rhenium) and have a thickness of approximately 0.01 inch.

Crucible 220 may be disposed within a susceptor 260 and on top of a crucible stand 270. Both susceptor 260 and crucible stand 270 may include or consist essentially of W. A crucible funnel 280 may be disposed above the top opening of crucible 220, and may include or consist essentially of molybdenum (Mo). Crucible funnel 280 is shaped to direct pellets from pellet loading mechanism 210 into crucible 220.

Furnace 200 is typically resistively heated by one or more heating elements 290, which are surrounded by insulation 292. Heating elements 290 may be heated to temperatures up to approximately 2300° C., and furnace 200 may operate at pressures up to approximately 60 bar. In an exemplary embodiment, the furnace operates at pressures up to approximately 10 bar. Generally, elevated pressures may enable the incorporation of high concentrations of dopants into polycrystalline source 130 (as described below) by limiting evaporation of the dopant species or a compound thereof. For example, when Si is utilized as a dopant, high furnace pressures may substantially prevent the evaporation of the Si in the form of $Si_3N_4$. Gas flows into furnace 200 from a bottom inlet 294 and is exhausted through a top outlet 296. The gas may include or consist essentially of nitrogen or a mixture of nitrogen and 3% hydrogen (i.e., forming gas), and is generally filtered by a gas filter (not shown) that reduces levels of contaminants such as oxygen, water vapor, and hydrocarbons to less than 10 parts per billion (ppb). An upper funnel 298 connects pellet loading mechanism 210 to crucible funnel 280.

In order to form doped polycrystalline source 130, pellets are desirably cleaned in preparation for loading into pellet loading mechanism 210. The pellets are preferably all similarly sized and shaped to facilitate automatic handling (as described below). First, the pellets are sifted in order to remove oddly shaped pellets or small shavings. The pellets are then ultrasonically cleaned in distilled water for approximately 20 minutes. Next, the pellets are immersed in a mixture of hydrofluoric acid (HF) and nitric acid ($HNO_3$) for approximately 2 minutes at room temperature. Finally, the pellets are rinsed in distilled water and multiple times in methanol, whereupon they may be stored in an inert atmosphere prior to loading into pellet loading mechanism 210. Cleaning doped or undoped Al pellets is important to produce consistent results and to provide a consistent surface oxidation (or reduced layer thereof) to the reaction for production of both doped and undoped polycrystalline source 130. In various embodiments (for both doped and undoped Al pellets), the Al pellets may be "cleaned" (i.e., have their surface oxidation layers removed or, at a minimum, substantially reduced, and/or have their surfaces passivated by an oxidation-resistant layer) by the acid-based treatments described herein or by other methods, e.g., plasma treatments.

Crucible 220 is loaded into furnace 200, and the pellets are loaded into pellet loading mechanism 210. A cleaning cycle, in which the pellets are not dropped into crucible 220, may be run prior to an actual reaction cycle in which polycrystalline source 130 is formed. Furnace 200 is alternately subjected to a flow of forming gas and evacuated several times (e.g., three times). Heating elements 290 are heated to approximately 2200° C., thus heating crucible 220 to approximately 1950° C. Forming gas is flowed through furnace 200 at a high rate, e.g., approximately 0.25 liters per minute (1 pm) in order to purge residual moisture and to reduce any W-containing components therein (which may have oxidized due to exposure to air or other sources of contamination). Heating elements 290 are then cooled back down to room temperature.

A reaction cycle is then performed to form polycrystalline source 130. Furnace 200 is alternately subjected to a flow of nitrogen and evacuated several times (e.g., three times). The reaction cycle may be performed at temperatures within the range of approximately 1600° C. to approximately 2200° C., and at pressures within the range of approximately 1 bar to approximately 60 bars. In an embodiment, the reaction cycle is performed at a pressure less than approximately 10 bar. In an exemplary embodiment, under a nitrogen pressure of approximately 1.5 bars and a nitrogen flow of approximately 0.25 lpm, heating elements 290 are heated to approximately 1800° C. (corresponding to a temperature of crucible 220 of approximately 1650° C.) and held at that temperature for approximately three hours. The gas flow is decreased to approximately 5 standard cubic centimeters per minute (sccm), and the pellets are dropped from pellet loading mechanism 210, through upper funnel 298 and crucible funnel 280, into crucible 220. The pellets may each weigh approximately 72 milligrams, and may be dropped at a rate of approximately 1 per minute. The pellets land on bottom plug 230 (or the portion of polycrystalline source 130 already produced thereon), melt, and react with the nitrogen gas to form polycrystalline source 130. Dopants present in the pellets are incorporated into polycrystalline source 130 at concentrations at least partially determined by the dopant concentration in the pellets and by the reaction kinetics. Very high intentional dopant concentrations in polycrystalline source 130, e.g., greater than approximately 1% and up to approximately 12% by weight, may be achieved by using very high concentrations of dopant in the pellet and by suppressing dopant evaporation by increasing the nitrogen pressure in reaction furnace 200. Each subsequent pellet dropped from pellet loading mechanism 210 reacts and increases the size and volume of polycrystalline source 130. In an embodiment, substantially all of each pellet reacts to form polycrystalline source 130.

After the reaction cycle, furnace 200 (and polycrystalline source 130) is cooled down to approximately room temperature over approximately 1 hour at a positive nitrogen pressure. Thus formed, polycrystalline source 130 may weigh up to approximately 80 grams, and may include low concentrations of impurities such as oxygen, boron, and transition metals such as iron. In an embodiment, an oxygen concentration (and/or concentration of other impurities) of polycrystalline source 130 is less than approximately 400 ppm by weight, and may even be less than approximately 100 ppm. In various embodiments, polycrystalline source 130 includes or consists essentially of doped or undoped AlN that is approximately stoichiometric, i.e., AlN that contains less than approximately 1% excess Al, less than approximately 0.5% excess Al, or even less than approximately 0.1% excess Al. Polycrystalline source 130 that is intentionally doped may include a concentration of a dopant species greater than that which may be present as a trace impurity in Al and/or AlN, e.g., greater than approximately 1% (by weight) and up to approximately 12% (by weight) of a dopant species such as a group IV element (e.g., Si or C), a group II element (e.g., Be or Mg) or a group VI element (e.g., O). After formation, polycrystalline source 130 may be immediately ready for subsequent sublimation-recondensation growth of single crystal AlN, and may be stored in an inert atmosphere in preparation therefor.

Production of High-Purity, High-Density AlN Polycrystalline Material

Referring to FIGS. 3A-3E, a reactor 300 may be utilized in the formation of polycrystalline source 130 consisting essentially of high-purity, undoped AlN. Reactor 300 includes a reaction vessel 310, which is preferably fabricated of double-walled stainless steel and is water cooled. Reaction vessel 310 is preferably capable of a maximum internal gas pressure of approximately 45 pounds per square inch (psi), and may be evacuated, e.g., by a turbo pump 311 (backed by a mechanical pump 312) to approximately $10^{-7}$ Torr. A feeder mechanism 320 is connected to the top of reaction vessel 310, and may be evacuated and pressurized with the same gases and pressures as reaction vessel 310. Feeder mechanism 320 may be isolated from reaction vessel 310 by an isolation valve 322. Pellets (which may consist essentially of high—(e.g., five nines) purity undoped Al and may be shaped approximately cylindrically) released from feeder mechanism 320 are directed to a crucible 330 by an upper funnel 332 and a lower funnel 334.

Crucible 330 includes a bottom plug 336 and a foil wrap 337. Bottom plug 336 may be approximately cylindrical with, e.g., a diameter of approximately 2 inches and a height of approximately 0.5 inches. Bottom plug 336 may include or consist essentially of W, or another high-melting-point material inert to AlN. Foil wrap 337 wraps around bottom plug 336, forming a cylinder open at the top and sealed at the bottom by bottom plug 336. Foil wrap 337 may include or consist essentially of W, or another high melting point material inert to AlN, and may have a thickness of approximately 0.001 inch. In an embodiment, foil wrap 337 may be wrapped around bottom plug 336 multiple times, e.g., a three-ply foil wrap 337 is formed by wrapping W foil around bottom plug 337 three times. Foil wrap 337 may be held in place by wire 338. Wire 338 may include or consist essentially of a tungsten-rhenium alloy (e.g., 25% rhenium) and have a thickness of approximately 0.01 inch.

Crucible 330 is typically disposed within a reaction zone 340 and on top of a crucible stand 342. Both reaction zone 340 and crucible stand 342 may include or consist essentially of W. Lower funnel 334 is disposed above the top opening of crucible 330, and may include or consist essentially of W. Lower funnel 334 is typically shaped to direct pellets from feeder mechanism 320 and upper funnel 332 into crucible 330.

Reactor 300 includes an inductive heating coil 350, which wraps around insulation 360. Insulation 360 may include or consist essentially of bubble alumina available from Zircar Ceramics, Inc. of Florida, New York, held within a quartz holder. Inductive-heating coil 350 may be a 10 kHz, 20 kilowatt inductive-heating system available from Mesta Electronics, Inc. of N. Huntingdon, Pa., and may heat to temperatures up to approximately 2300° C. An optical pyrometer port 362 enables the measurement of temperature inside the reaction zone defined by inductive-heating coil 350 by pyrometry. Gas from a series of gas tanks representatively indicated at 368 flows into reactor 300 from a bottom inlet 370 and/or a top inlet 372. The gas may include or consist essentially of nitrogen or forming gas, and is generally filtered by a gas filter 374 that reduces levels of contaminants such as oxygen, water vapor, and hydrocarbons to less than 10 ppb. A vertical drive 380 may be used to move crucible 330 in and out of the hot zone created by inductive heating coil 350. A conventional control station 390 includes electronic controls and power supplies for all of the components associated with reactor 300.

Figure 4:
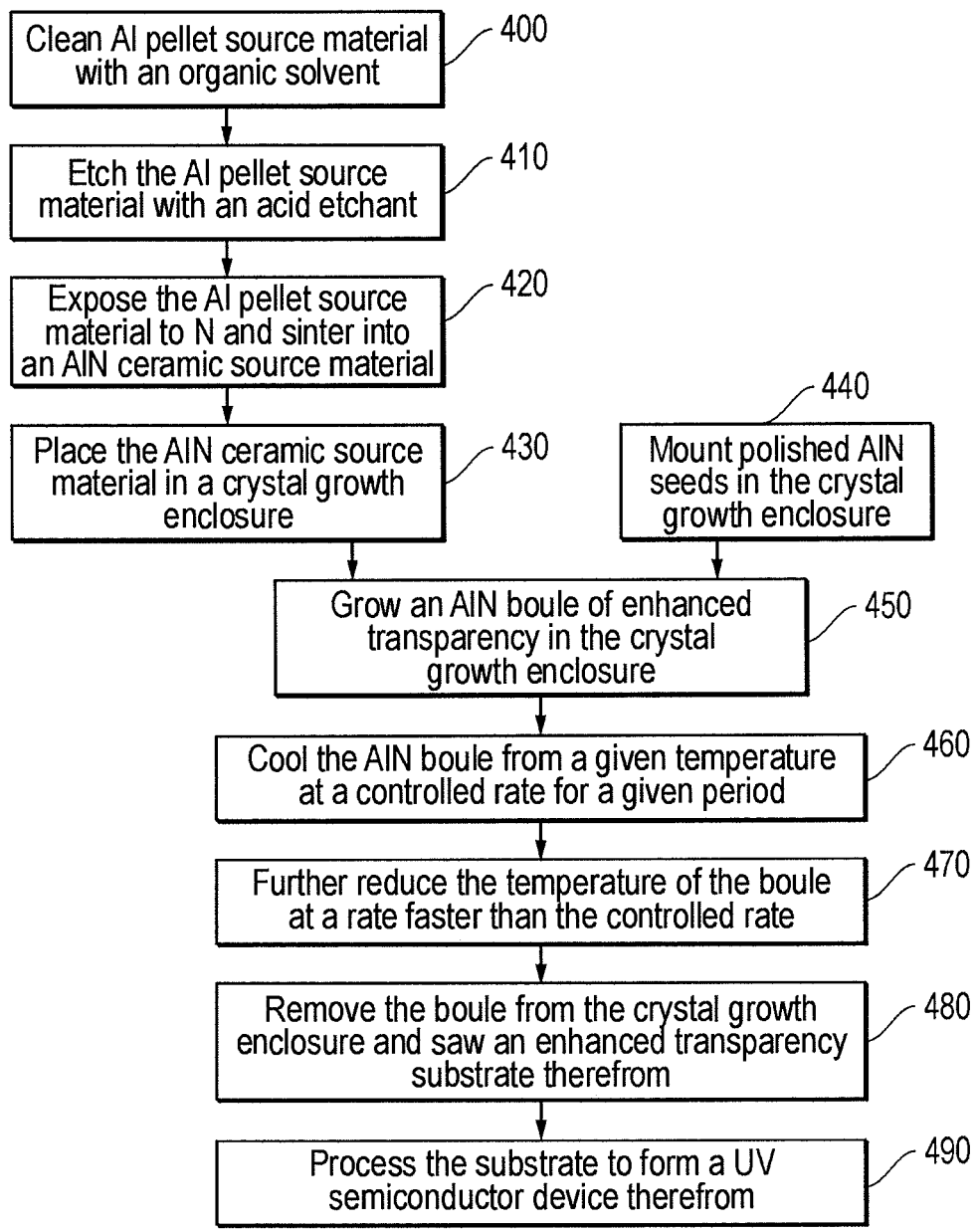
FIG. 4 is a flowchart summarizing embodiments of techniques for forming high purity/high transparency AlN crystals and substrates.

With reference to FIG. 4, in order to form undoped polycrystalline source 130, pellets are preferably cleaned in preparation for loading into feeder mechanism 320, as indicated in steps 400 and 410. In various embodiments, the pellets are sifted (with or without water) in order to remove oddly shaped pellets or small shavings. The pellets are then ultrasonically cleaned in an organic solvent (e.g., methanol) for approximately 20 minutes, etched for approximately 7 minutes in hydrochloric acid (HCl), and rinsed several times (e.g. three times) in distilled water. After another ultrasonic clean in, e.g., methanol, for approximately 20 minutes, the pellets are immersed in a mixture of HF and $HNO_3$ for approximately 2 minutes at room temperature. Finally, the pellets are rinsed in distilled water and multiple times in, e.g., methanol, whereupon they may be stored in an inert or nitrogen atmosphere prior to loading in feeder mechanism 320.

Crucible 330 is loaded into reactor 300, and pellets are loaded into feeder mechanism 320. Reaction chamber 310 and feeder mechanism 320 are evacuated, e.g., to a pressure less than approximately $5 \times 10^{-5}$ Torr, and refilled with forming gas to a pressure of approximately 6 psi. Either nitrogen ($N_2$) gas or forming gas flows into reaction chamber 310 from bottom inlet 370 and top inlet 372 at a rate of, e.g., approximately 0.25 lpm. The flow of gas provides a sufficient amount of nitrogen in reaction chamber 310 to convert the pellet(s) to AlN (as described below). Inductive heating coil 350 heats crucible 330 to approximately 1900-2200° C., but even higher temperatures may be utilized. In a preferred embodiment, inductive heating coil 350 heats crucible 330 to approximately 2000-2050° C. Temperatures in this range have been found to be sufficient to totally react the pellets into stoichiometric AlN (which includes less than approximately 1% unreacted Al, less than approximately 0.5% unreacted Al, or even less than approximately 0.1% unreacted Al) and to drive off higher-vapor-pressure impurities that may be trapped within polycrystalline source 130 and create optical absorptions. The temperature at crucible 330 may be measured by pyrometry through optical pyrometer port 362. Once crucible 330 reaches the desired temperature, the temperature and gas flow conditions within reactor 300 are held constant for an approximately three-hour pre-soak cycle. The pre-soak cleans crucible 330 and other parts of reactor 300 of contaminants, e.g., oxides, before the introduction of the Al pellets.

A reaction cycle is then performed to form undoped polycrystalline source 130. Pellets are dropped from feeder mechanism 320, through upper funnel 332 and lower funnel 334, into crucible 330. The pellets may each weigh approximately 0.23 gram, and may be dropped at a rate of approximately one every 90 seconds. Feeder mechanism 320 may incorporate an optical counter that counts actual pellet drops and may cycle feeder mechanism 320 to drop an additional pellet in case of a loading error. The pellets land on bottom plug 336 (or the portion of polycrystalline source 130 already produced thereon), melt, and react with the nitrogen gas to form undoped polycrystalline source 130, as indicated in step 420 of FIG. 4. Each subsequent pellet dropped from feeder mechanism 320 reacts and increases the size and volume of polycrystalline source 130. In an embodiment, substantially all of each pellet reacts to form polycrystalline source 130. After a desired number of pellets are reacted to form polycrystalline source 130, the reaction-gas flow rate and temperature are maintained for approximately 1 hour to ensure that the reaction is complete.

After the reaction cycle, crucible 330 (and polycrystalline source 130) is cooled down to approximately room temperature over, e.g., approximately 1 hour at a positive nitrogen pressure. Thus formed, polycrystalline source 130 may weigh up to approximately 155 grams, and consists essentially of high-purity, undoped AlN. In an embodiment, an oxygen concentration (and/or concentration of other impurities such as boron or transition metals) of polycrystalline source 130 is less than approximately 400 ppm by weight, and may even be less than approximately 100 ppm. Polycrystalline source 130 includes or consists essentially of undoped AlN that is approximately stoichiometric, i.e., AlN that contains less than approximately 1% excess Al, less than approximately 0.5% excess Al, or even less than approximately 0.1% excess Al. After formation, polycrystalline source 130 may be immediately ready for subsequent sublimation-recondensation growth of single crystal AlN, and may be stored in an inert atmosphere in preparation therefor.

Formation of Single-Crystal AlN

Once doped or undoped polycrystalline source 130 has been fabricated by one of the techniques described above with reference to FIGS. 2A and 2B and 3A-3E, it may be utilized in the sublimation-recondensation growth of single-crystal AlN as described above with reference to FIG. 1. Because polycrystalline source 130 is generally approximately stoichiometric AlN with low concentrations of impurities, it may be used to form AlN crystal 120 without further preparation (e.g., without intermediate sublimation-recondensation steps). Polycrystalline source 130 is separated from bottom plug 230 (or bottom plug 336), but foil wrap 240 (or foil wrap 337) typically remains proximate and in contact with polycrystalline source 130. Foil wrap 240 (or foil wrap 337) may remain in contact with polycrystalline source 130 and placed in crystal growth enclosure 100. Since foil wrap 240 (or foil wrap 337) is formed of W or other material inert to AlN, it does not react with or contaminate AlN crystal 120 during its formation. In an embodiment, polycrystalline source 130, surrounded by foil wrap 240 (or foil wrap 337) may be broken into smaller pieces, and one or more of them may be utilized separately to form AlN crystal 120. In this embodiment, pieces of foil wrap 240 (or foil wrap 337) may remain in contact with the pieces of polycrystalline source 130. In another embodiment, foil wrap 240 (or foil wrap 337) may be formed of the same material as crystal growth enclosure 100, e.g., W. As indicated in steps 430 and 450 of FIG. 4, at least a portion of polycrystalline source 130 (e.g., with or without foil wrap 240 or foil wrap 337) is placed in crystal growth enclosure 100 for formation of AlN crystal 120 by, e.g., sublimation-recondensation (as described above). One or more seeds (e.g., that include or consist essentially of AlN) may also be placed within crystal growth enclosure 100 in various embodiments (as indicated in step 440 of FIG. 4), and in such embodiments, AlN crystal 120 nucleates and grows on the seed(s). Alternatively, AlN crystal 120 may be formed without a seed, as described above.

Figure 6:
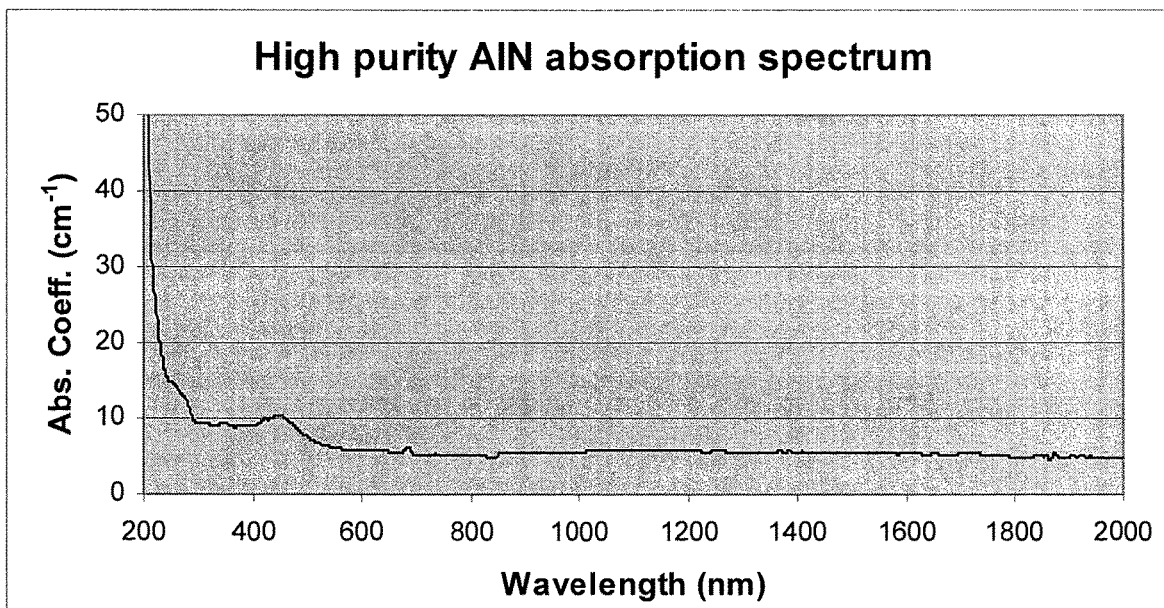
FIG. 6 is an absorption spectrum of an AlN substrate in accordance with embodiments of the invention having high transparency in the ultraviolet, visible, and infrared regions ranging from 200 nm up to 2000 nm.

The AlN crystal 120 at this point may have an absorption coefficient less than approximately 20 cm$^{-1}$ in the entire wavelength range between about 4500 nm and approximately 215 nm, and preferably less than about 10 cm$^{-1}$ for the entire wavelength range between approximately 400 nm and approximately 250 nm. The oxygen concentration (and/or concentrations of other impurities) may be less than approximately 50 ppm by weight, or even less than approximately 5 ppm by weight. As detailed in FIG. 4, additional cooling techniques may be applied to the AlN crystal 120 to facilitate its retention of a coefficient of absorption no more than about 20 cm$^{-1}$ in the entire range between about 4500 nm and approximately 215 nm (as also shown in FIG. 6).

As indicated in step 460 of FIG. 4, the AlN crystal 120 may be cooled from the growth temperature at a controlled rate for an initial period of time, e.g., until AlN crystal 120 reaches a temperature of approximately 1800° C. In this manner, the formation of light-absorbing point defects within AlN crystal 120 may be markedly reduced, enabling retention of the above-described low absorption coefficients. In various embodiments, the cooling rate may be less than approximately 250° C./hr. The cooling rate may even range between approximately 150° C./hr and approximately 70° C./hr from the growth temperature down to approximately 1800° C., or even down to approximately 1500° C. For example, in an embodiment where the growth temperature is about 2300° C., this initial cooling period may be approximately two hours.

Following the initial cooling period, the temperature of AlN crystal 120 is generally at about 1500° C.-1800° C. By slowing the cool down of AlN crystal 120 from growth temperature for this initial period, the formation of light-absorbing point defects which may lead to undesirable absorption bands is substantially avoided. Of particular note, absorption bands in the 300 nm-350 nm range may be avoided as a result of the described controlled cooling in the initial period. FIG. 6 depicts an exemplary measured absorption spectrum for high-purity AlN fabricated in accordance with embodiments of the present invention. As shown, after the controlled cooling, AlN crystal may have an absorption coefficient below approximately 10 cm$^{-1}$ for the entire wavelength range between 300 nm and 350 nm. By contrast, AlN crystals cooled at a faster rate in the above-described temperature regime generally accumulate high densities of point defects that result in higher absorption coefficients in the above-described wavelength ranges. For example, after controlled cooling, the optical absorption in the above wavelength range may be reduced by as much as 15× (due to lower concentrations of point defects) compared to that obtained with an uncontrolled cooling rate.

With continued reference to FIG. 4, controlled cooling of AlN crystal 120 from the growth temperature may also have the additional advantage of minimizing or eliminating deleterious cracking. As a result, AlN crystal 120 may have a diameter of, e.g., two or more inches as described above, without significant concern over compromise to the structural integrity or transparency of the boule. Additionally, after approximately two hours or cooling, and/or after cooling to a temperature of less than approximately 1800° C. to approximately 1500° C., the temperature of AlN crystal 120 may be reduced at a greater rate without significant concern over the formation of such defects. That is, as indicated in step 470 of FIG. 4, AlN crystal 120 may be allowed to cool to, e.g., approximately room temperature at a faster rate than the above-described initial controlled rate, e.g., a rate resulting from cooling without a controlled application of heat to slow the cooling. Allowing AlN crystal 120 to cool at this subsequent faster rate may substantially reduce processing time and provide significant cost savings in terms of process efficiency.

Figure 5:
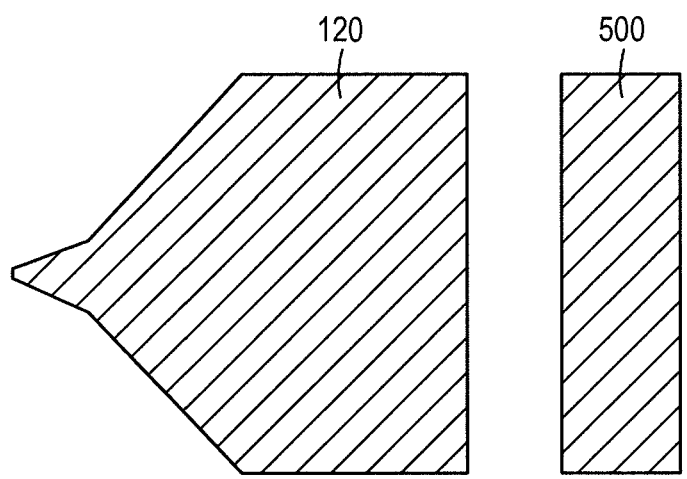
FIG. 5 schematically depicts an AlN wafer separated from a boule of single-crystalline AlN.

Referring to FIG. 5, after formation of AlN crystal 120, wafer 500 may be separated from AlN crystal 120 by the use of, e.g., a diamond annular saw or a wire saw, as also indicated in step 480 of FIG. 4. In an embodiment, a crystalline orientation of wafer 500 may be within approximately 2° of the (0001) face (i.e., the c-face). Such c-face wafers may have an Al-polarity surface or an N-polarity surface, and may subsequently be prepared as described in U.S. Pat. No. 7,037,838 or U.S. Patent Application Publication No. 2006/0288929, the entire disclosures of which are hereby incorporated by reference. In other embodiments, wafer 500 may be oriented within approximately 2° of an m-face or a-face orientation (thus having a non-polar orientation) or may have a semi-polar orientation if AlN crystal 120 is cut along a different direction. The surfaces of these wafers may also be prepared as described in U.S. Pat. No. 7,037,838. Wafer 500 may have a roughly circular cross-sectional area with a diameter of greater than approximately 2 cm. In an alternate embodiment, a surface area of wafer 500 may be greater than approximately 1 cm$^2$, or even greater than approximately 3 cm$^2$, and may be shaped like a quadrilateral or other polygon. A thickness of wafer 500 may be greater than approximately 100 μm, greater than approximately 200 μm, or even greater than approximately 2 mm. Wafer 500 preferably has the properties of AlN crystal 120, as described herein. For example, the oxygen concentration of wafer 500 sliced from AlN crystal 120 prepared with high-purity polycrystalline source 130 may be less than approximately 5×10$^{17}$ cm$^{-3}$ (i.e., less than approximately 5 ppm per weight), as measured, for example, by SIMS.

When a doped polycrystalline source 130 including a dopant species is used to form AlN crystal 120, AlN crystal 120 and wafer 500 may both incorporate the dopant species at a concentration greater than approximately 10$^{16}$/cm$^3$. Depending on the particular dopant species, AlN crystal 120 and/or wafer 500 may exhibit n-type or p-type conductivity. In an embodiment, an oxygen concentration (and/or concentration of other impurities such as boron or transition metals such as iron) of AlN crystal 120 and/or wafer 500 is less than approximately 400 parts per million by weight (ppm), and may even be less than approximately 100 ppm, or even less than approximately 50 ppm. The oxygen concentration may also be less than approximately 4.5×10$^{19}$/cm$^3$, or even less than 1×10$^{19}$/cm$^3$, as measured by dynamic SIMS. A conductivity of AlN crystal 120 and/or wafer 500 at room temperature may be greater than approximately 10$^{-4}$Ω$^{-1}$ cm$^{-1}$, or even greater than approximately 10$^{-2}$Ω$^{-1}$ cm$^{-1}$. A thermal conductivity of AlN crystal 120 and/or wafer 500 may be greater than approximately 270 Watts per meter-Kelvin (W/m·K), a value preferably measured by the American Society for Testing and Materials (ASTM) Standard E1461-01 (Current Industry Standard Test Method for Thermal Diffusivity of Solids by the Laser Flash Method), and provided by a commercial vendor such as NETZSCH Inc. of Exton, Pa.

Vapor Pressures of AlN and Si$_3$N$_4$

The relative Si, Al, and N$_2$ vapor pressures as a function of temperature may strongly affect growth of Si-doped AlN crystals. These vapor pressures may be calculated from the JANAF tables (M. W. Chase, Jr., Journal of Physical and Chemical Reference Data, Monograph No. 9, NIST-JANAF Thermochemical Tables, Fourth edition (1998)), the entire disclosure of which is hereby incorporated by reference. The AlN evaporates congruently as Al atoms and $N_2$ molecules with very small traces of $Al_2$ and AlN vapor molecules. If there is any $Si_3N_4$ in the source, then, at a temperature of 2300° C. that is typically used for growing AlN, the nitrogen pressure over $Si_3N_4$ solid is 53 bars. Accordingly, the decomposition pressure of solid $Si_3N_4$ is substantially higher than that of solid AlN. When a small amount of either Si or $Si_3N_4$ is dissolved in AlN, however, the Si vapor pressure is much reduced. If the crystal composition is $AlN_{1-x}Si_x$, then the total pressure of Si in the gas phase is roughly $P(Si)=x \times P(Al)$. This is due to the fact that the Si to Al ratio in the equilibrium gas phase is the same as in the solid.

The partial pressure of Al vapor over AlN in 1 bar of $N_2$ at 2300° C. is 0.09 bars. If x is 0.10, then $P(Si)=0.009$ bar. This is about the same as the Si partial pressure over $Si_3N_4$ at this temperature, which is 0.008 bar. During crystal growth, the $N_2$ pressure over the AlN is typically kept between 0.5 and 10 bar, with 1.2 bar being preferred. This nitrogen pressure is much less than the $N_2$ pressure of 53 bars needed to form solid $Si_3N_4$. Thus, no $Si_3N_4$ is formed under these conditions. The Si atoms are transported to the growing Al crystal as mostly $Si_1$ atoms (over 80%) although some transport may be expected as SiN, $Si_2N$, $Si_2$ and $Si_3$ gas-phase molecules. Undoped AlN will grow very close to stoichiometric. The nitrogen vacancy ($V_N$) concentration depends on the growth temperature and the nitrogen pressure; for growth at 2300° C., the aluminum nitride grows as $Al_1N_{1-y}(V_N)_y$, where y may be $\sim 10^{-4}$ at 1 bar $N_2$.

Silicon-Doped AlN Crystals

After making silicon-doped AlN ceramic by reacting Al—Si alloys with nitrogen, this material may be used to grow crystals by the evaporation-recondensation or solid-gas-solid technique. Tungsten crucibles are typically employed for growing AlN; as explained herein, the same crucibles may be used for growing Si-doped AlN crystals if the nitrogen pressure is between 0.5 to 10 bar and the temperature is 2000° C. to 2300° C. The Si—W system possesses two intermediate compounds: $WSi_2$ (melting point (m.p.) 2160° C.) and $W_5Si_3$ (m.p. 2320° C.). The partial pressure of Si in the gas phase is preferably maintained low enough to prevent the formulation of these phases at the growth temperature. For Si/Al ratios of up to 0.1 (10%), substantially no reaction of Si with the tungsten should occur although there may be some absorption of Si by a tungsten crucible.

Thus, to achieve higher doping levels and/or to increase the fraction of Si that is captured in the growing crystal from a Si-doped AlN ceramic, it may be desirable to use a crucible constructed of an alternative material. See, e.g., G. A. Slack, J. Whitlock, K. Morgan, and L. J. Schowalter, Mat. Res. Soc. Proc. 798, Y10.74.1 (2004), the entire disclosure of which is hereby incorporated by reference. In an embodiment a TaC crucible (e.g., prepared as described in U.S. Pat. No. 7,211,146, the entire disclosure of which is hereby incorporated by reference) is used, as it may not react with either the AlN or $Si_3N_4$, nor with the Al and Si vapors, in the temperature range of approximately 1800° C. to approximately 2300° C. and nitrogen pressures from approximately 1 bar to 60 bars.

Treated and Untreated Crystals

In analogy with the $AlN—Al_2O_3$ system where $Al_2O_3$ plus an Al vacancy enters the AlN lattice as $Al_2V_{Al}O_3$, at high concentrations of Si, one expects to obtain a mixed crystal of $AlN—Si_3V_{Al}N_4$, with each $Si_3N_4$ molecule introducing one Al atom vacancy. Unfortunately, the introduction of Al vacancies will generally introduce acceptor levels which will compensate the Si donor levels. Thus, it is desirable to suppress the formation of $Si_3V_{Al}N_4$ in the AlN crystal.

In thin epitaxial layers of AlN grown on diamond substrates with Si doping in this range by R. Zeisel, et al., *Phys. Rev.* B61, R16283 (2000), the entire disclosure of which is hereby incorporated by reference, the apparent activation energy for conduction was shown to vary from about 100 to 600 meV with the material becoming less conducting as the Si concentration increases. Zeisel et al. suggested that Si impurities in AlN to form a DX-center that has a high activation energy. However, C. G. Vande Walle, *Phys. Rev.* B57 R2033 (1998) and C. G. Vande Walle, et al. *MRS Internet J. Nitride Semicond. Res.* 4S1, G10.4 (1999), the entire disclosures of which are hereby incorporated by reference, have shown that Si in AlN does not form such centers and typically stays centered on an Al lattice site. The decrease observed in the electrical activity of the Si by Zeisel et al. may be caused by an increasing concentration of Al vacancies as the Si content increases. This agrees with the simple idea that Si atoms enter the AlN lattice as $Si_3V_{Al}N_4$ in order to maintain charge neutrality. Here $V_{Al}$ designates an aluminum atom vacancy. In accordance with this latter model, then one may activate the Si by generating nitrogen vacancies in the AlN lattice. The nitrogen vacancies will tend to convert the $Si_3N_4$ to SiN by combining with aluminum vacancies to form voids. When the conversion is complete, nearly all of the Si atoms are typically electrically active.

Doped AlN crystals are typically grown under conditions which generate nitrogen vacancies as described above. However, it is also possible to anneal AlN crystal 120 after growth by reducing the nitrogen partial pressure in vapor mixture 110 above the crystal while keeping crystal growth enclosure 100 in nearly an isothermal environment at a temperature above 1800° C., as described above. Crystal growth enclosure 100 may be made from W, but alternative crucible materials, such as TaC, may be preferred to reduce the loss of dopant (e.g., Si) through its walls.

If AlN crystals with Si concentrations greater than $1.3 \times 10^{21}$ cm$^{-3}$ are grown, then, according to Hermann et al., *Appl. Phys. Letters* 86 192108 (2005), the entire disclosure of which is hereby incorporated by reference, the crystals will be electrically degenerate and the resistivity can be as low as 2 to 3 Ω-cm at room temperature. Even lower resistivities may result if the formation of $V_{Al}$ is suppressed as described herein.

Annealing Treatments

Annealing treatments may be employed as a means of controlling the nitrogen vacancy content, aluminum vacancy content, and/or dopant electrical activation in wafer 500 cut from AlN crystal 120. Exemplary AlN crystal 120 doped with Si is grown at nitrogen pressures between 0.5 and 10 bars; lower $N_2$ pressures may significantly slow the growth rate or suppress it entirely. Once grown, however, some of the nitrogen may be extracted from AlN crystal 120 or wafer 500, i.e., nitrogen vacancies may be injected into the material. Wafer 500 may be annealed at a temperature greater than approximately 1900° C. in order to electrically activate a dopant species therein. The annealing may also decrease a concentration of Al vacancies and/or increase a concentration of N vacancies in wafer 500.

As the $N_2$ pressure is reduced around the crystal at approximately 1900° C. or above, the nitrogen diffuses out. In an embodiment, a suitable $N_2$ pressure at temperature T for creating the maximum number of N vacancies is greater than the pressure required to form AlN from Al at the same temperature T. For example, for an annealing temperature of 2000° C., a suitable $N_2$ pressure used during annealing may be selected from the range of approximately 2 millibar (mbar) to approximately 0.5 bar. The $N_2$ pressure may be less than approximately twice a $N_2$ pressure required to form AlN from Al at temperature T. In an embodiment, the $N_2$ pressure used during annealing is selected from the range of approximately 0.1 mbar and approximately 5 bars. Higher pressures may generally be preferred at higher temperatures. In another embodiment, an inert gas such as argon (Ar) is introduced during the annealing to suppress Al evaporation as discussed below. The reduction of "$Si_3N_4$" in solution in the AlN crystal to form SiN happens before the decomposition of $Al_1N_1$ to $Al_1N_{1-\epsilon}$, where $\epsilon$ is the nitrogen loss expected in undoped AlN. The Al vacancies and nitrogen vacancies may combine and be replaced by lattice voids or surface pits and the chemical composition becomes $Al_{1-x}Si_xN_1$. Essentially the Si is now present as SiN and is thus electrically active as a donor. When it was present as $Si_3N_4$, it was electrically inactive. After annealing, substantially all of a dopant species (such as Si) present in wafer 400 may be electrically activated. A conductivity of annealed wafer 400 may be greater than approximately $10^{-4}\Omega^{-1}$ cm$^{-1}$, or even greater than approximately $10^{-2}\Omega^{-1}$ cm$^{-1}$, at room temperature.

Making N-Type AlN Using Only Nitrogen Vacancies

Annealing may generate enough nitrogen vacancies in undoped AlN so that the electron donors are the excess Al atoms. In this case, one may anneal undoped wafer 500 in a low $N_2$ gas pressure at temperatures between 1700° C. and 2200° C. During the anneal, some of the nitrogen in the AlN will diffuse out to the surface and escape, leaving the Al behind. This is preferably done in a flowing argon-nitrogen atmosphere at a total pressure within the range of approximately 2 bars to approximately 30 bars. The argon prevents the Al from evaporating. The nitrogen pressure is just enough to keep the AlN from converting back to metallic aluminum. That is, the pressure of $N_2$ is greater than the $N_2$ pressure required to form AlN from Al at the anneal temperature. Annealed undoped wafer 500 (consisting essentially of AlN with no extrinsic electron-donating dopants) may have a conductivity greater than approximately $10^{-2}\Omega^{-1}$ cm$^{-1}$ at room temperature. Such conductivity may be supplied by excess Al atoms (equivalently, by nitrogen vacancies) in the AlN lattice.

It will be seen that the techniques described herein provide a basis for production of undoped and doped crystals including AlN and AlGaN.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A doped single-crystalline structure comprising $Al_{1-x}Si_xN$, wherein the doped single-crystalline structure (i) has a conductivity greater than approximately $10^{-2}\Omega^{-1}$ cm$^{-1}$ at room temperature, (ii) has the form of a wafer having a thickness no less than 100 μm, and (iii) has a diameter no less than 1 cm,
   wherein the doped single-crystalline structure is substantially free of $Si_3V_{Al}N_4$, $V_{Al}$ representing an aluminum vacancy.

2. The structure of claim 1, wherein an oxygen concentration of the doped single-crystalline structure is less than 50 ppm by weight.

3. The structure of claim 1, wherein an oxygen concentration of the doped single-crystalline structure is less than 5 ppm by weight.

4. The structure of claim 1, wherein a thermal conductivity of the doped single-crystalline structure is greater than 270 W/m·K, as measured by the ASTM Standard E1461-01.

5. The crystal of claim 1, wherein the conductivity is n-type.

6. The structure of claim 1, wherein the doped single-crystalline structure has a coefficient of optical absorption no more than 20 cm$^{-1}$ over the entire wavelength range of 215 nm to 4500 nm.

7. The structure of claim 6, wherein the coefficient of optical absorption is less than 10 cm$^{-1}$ over the entire wavelength range of 250 nm to 400 nm.

8. The structure of claim 6, wherein the coefficient of optical absorption is less than 10 cm$^{-1}$ over the entire wavelength range of 300 nm to 350 nm.

9. A doped single-crystalline structure comprising $Al_{1-x}Si_xN$, wherein the doped single-crystalline structure (i) has a conductivity greater than approximately $10^{-2}\Omega^{-1}$ cm$^{-1}$ at room temperature, (ii) has the form of a wafer having a thickness no less than 100 μm, and (iii) has a diameter no less than 1 cm, and
   within the doped single-crystalline structure, an amount of Si present as SiN exceeds an amount of Si present as $Si_3N_4$.

10. The structure of claim 9, wherein an oxygen concentration of the doped single-crystalline structure is less than 50 ppm by weight.

11. The structure of claim 9, wherein an oxygen concentration of the doped single-crystalline structure is less than 5 ppm by weight.

12. The structure of claim 9, wherein a thermal conductivity of the doped single-crystalline structure is greater than 270 W/m·K, as measured by the ASTM Standard E1461-01.

13. The structure of claim 9, wherein the doped single-crystalline structure has a coefficient of optical absorption no more than 20 cm$^{-1}$ over the entire wavelength range of 215 nm to 4500 nm.

14. The structure of claim 13, wherein the coefficient of optical absorption is less than 10 cm$^{-1}$ over the entire wavelength range of 250 nm to 400 nm.

15. The structure of claim 13, wherein the coefficient of optical absorption is less than 10 cm$^{-1}$ over the entire wavelength range of 300 nm to 350 nm.

16. A single-crystalline bulk AlN crystal having (i) a conductivity greater than approximately $10^{-2}\Omega^{-1}$ cm$^{-1}$ at room temperature, (ii) the form of a wafer having a thickness no less than 100 μm, and (iii) a diameter no less than 1 cm,
   wherein (i) the AlN crystal is substantially free of extrinsic electron-donating dopants, (ii) the conductivity is n-type, and (iii) the conductivity of the AlN crystal arises at least in part from the presence of excess Al atoms and nitrogen vacancies therein.

17. The crystal of claim 16, wherein an oxygen concentration of the AlN crystal is less than 50 ppm by weight.

18. The crystal of claim 16, wherein an oxygen concentration of the AlN crystal is less than 5 ppm by weight.

19. The crystal of claim 16, wherein a thermal conductivity of the AlN crystal is greater than 270 W/m·K, as measured by the ASTM Standard E1461-01.

20. The crystal of claim 16, wherein the AlN crystal has a coefficient of optical absorption no more than 20 cm$^{-1}$ over the entire wavelength range of 215 nm to 4500 nm.

21. The crystal of claim 20, wherein the coefficient of optical absorption is less than 10 cm$^{-1}$ over the entire wavelength range of 250 nm to 400 nm.

22. The crystal of claim 20, wherein the coefficient of optical absorption is less than 10 cm$^{-1}$ over the entire wavelength range of 300 nm to 350 nm.

\* \* \* \* \*